United States Patent [19]

Clinton

[11] Patent Number: 4,517,510
[45] Date of Patent: May 14, 1985

[54] APPARATUS FOR TESTING THE INSULATION OF ELECTRIC WIRE OR CABLE

[76] Inventor: Henry H. Clinton, 10 Shore Rd., Clinton, Conn. 06410

[21] Appl. No.: 486,809

[22] Filed: Apr. 20, 1983

[51] Int. Cl.³ ............................................. G01R 31/08
[52] U.S. Cl. ...................................................... 324/52
[58] Field of Search ............................. 324/51, 52, 54

[56] References Cited

U.S. PATENT DOCUMENTS 2,794,170  5/1957  Gooding ................................ 324/54

Primary Examiner—Stanley T. Krawczewicz
Assistant Examiner—Jose M. Solis
Attorney, Agent, or Firm—McCormick, Paulding & Huber

[57] ABSTRACT

An insulated wire having one end grounded is passed in an unaltered path through an unconfined stream of water to which an electric potential has been applied. Faults, such as pinholes or voids, in the insulation are detected by a current flowing from a variable voltage power source through the wire to ground. A fault indicator provides a signal responsive to the current flow. Water is replenished by dripping individual droplets from a faucet into the testing apparatus to establish electrical isolation between the water faucet and the testing apparatus.

16 Claims, 1 Drawing Figure

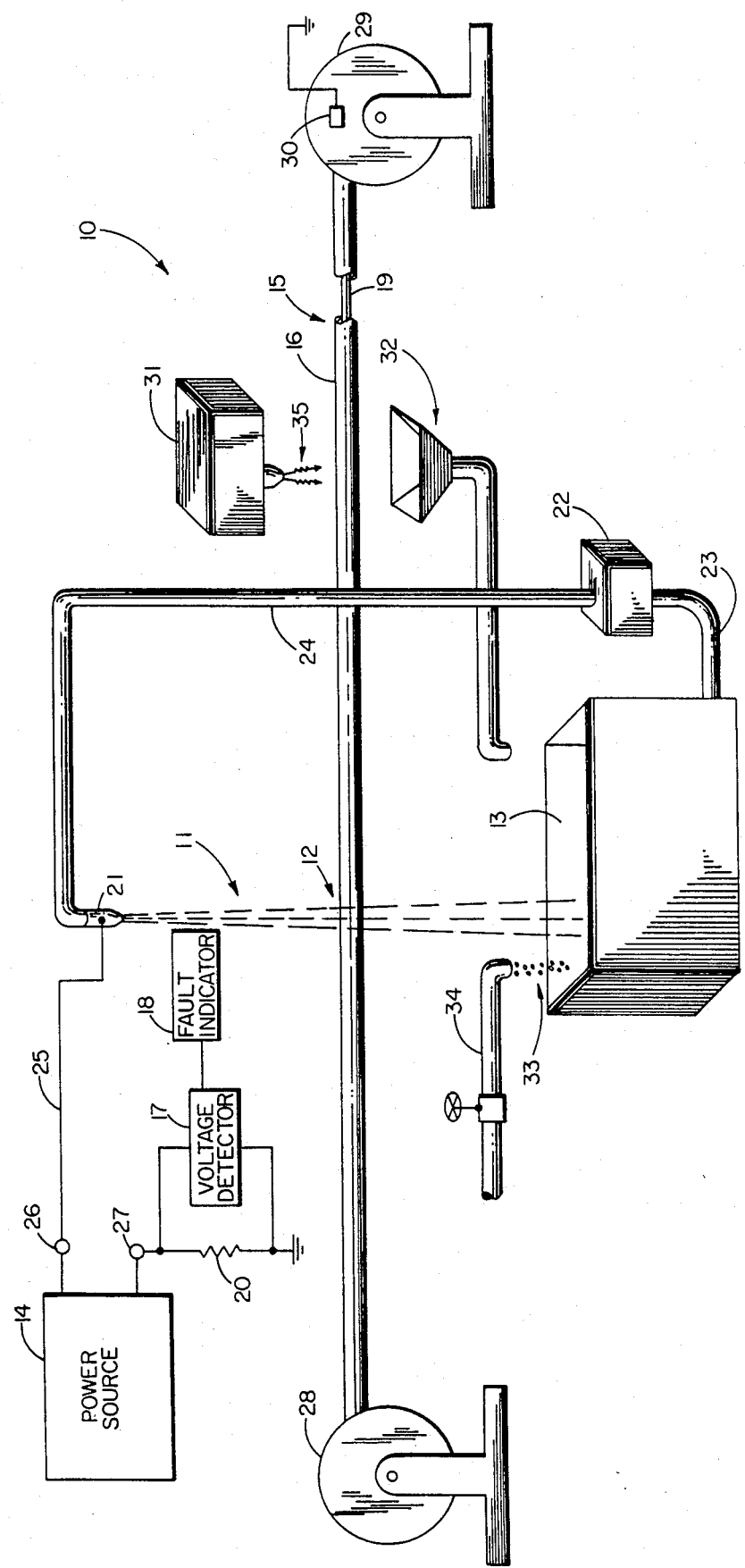

APPARATUS FOR TESTING THE INSULATION OF ELECTRIC WIRE OR CABLE

BACKGROUND OF THE INVENTION

This invention relates to devices for testing insulated electrical wire or cable, usually either during or immediately after manufacture, to search for faults in the insulation and deals more particularly with such devices wherein an electrical potential is applied to the outer surface of the insulation jacket by a suitable liquid electrode and faults such as pinholes or voids are detected by sensing the current supplied to the electrode.

Insulated electrical conductors, such as wire or cable, are usually subjected to testing prior to use to check for any unseen imperfections which may be present in the insulation. One common method of testing is to pass the insulated conductor, which is suitably grounded, through an electrode of some kind such as a beaded chain curtain which applies a high test voltage to the outer surface of the insulation. Any fault in the insulation will result in an arc or spark between the conductor of the wire and the electrode at the point in the insulation where the fault occurs causing a current to flow in the conductor to ground. Movement of the wire through the curtain may cause the curtain to move out of contact with the insulation surface thereby creating an air gap between the electrode and the wire. However, since relatively high test voltages are used in spark testing devices, the air gap between the electrode and the fault is arced causing a current to flow in the conductor to ground. The voltages of such spark testing devices often exceed the dielectric strength of smaller diameter, more fragile wire such as telecommunication and computer wire which may blow holes in the insulation during testing. Accordingly, it is desirable to have a wire testing apparatus using lower test voltages to test lower dielectric strength insulated wire.

When low test voltages are used with spark type testing devices of the beaded curtain type, unreliable test results often occur since the electrode may not maintain continuous surface contact with the insulation surface as the wire moves through the beaded curtain. The low test voltages are generally insufficient to arc the air gap to cause current to flow in the conductor to ground to detect the fault. Additionally, changing electrode characteristics caused by dirt accumulation, wear and changes in ambient humidity affect the reliability of electrode contact with the insulation surface.

One approach to solving the aforedescribed problem is to use a confined liquid bath as the electrode. One such liquid bath testing device requires immersing the wire in the bath and applying a high alternating test voltage between the wire and the liquid and measuring the current flowing in the conductor to determine the overall condition of the insulation; however, this device fails to detect individual faults. Another liquid bath testing device requires altering or bending the path along which the wire travels to accommodate entry to and exit from the liquid bath which can reduce the speed of the wire passing through the bath. Still other liquid bath type testing devices having specific ionic conductivity levels and temperatures are more complex and more difficult to maintain.

Accordingly, it is the general object of this invention to provide an improved low voltage wire insulation testing apparatus having a liquid electrode.

Other objects and advantages of the invention will be apparent from the following written description and from the drawing forming a part hereof.

SUMMARY OF THE INVENTION

The invention resides in an apparatus using an electrically conductive liquid for testing the insulation of insulated wire for faults. The apparatus comprises means for creating an unconfined stream of conductive liquid flowing past a test station in one direction and means for moving the wire under test transversely through the stream at the test station. The conductor of the wire is electrically grounded at one end. A power source applies an electrical potential to the stream. Means are provided for detecting the current flowing in the conductor when a fault passes through the stream.

BRIEF DESCRIPTION OF THE DRAWING

The single FIGURE of the drawing is a diagrammatic illustration of a testing apparatus embodying the invention.

DETAILED DESCRIPTION

Referring now to the drawing, an apparatus embodying the present invention is indicated generally by the numeral 10. The apparatus 10 is particularly adapted for testing the insulation of an insulated wire 15, one end of which is electrically grounded, by a stream of electrically conductive liquid 11 which flows through a test station indicated generally at 12 and onto the insulated wire 15 which also passes through the test station in a direction transverse to the stream. A power source 14 applies an electrical potential to the stream 11 causing an electrical current to flow to ground through the insulated wire 15 when a fault such as a pinhole or void in the insulation jacket 16 passes through the test station 12. A voltage detector 17 senses the current flow caused by the fault and drives a fault indicator 18.

Still referring to the drawing, in the illustrated case the stream of electrically conductive liquid 11 is created by a discharge spout 21 located above the test station 12 and in general vertical alignment therewith so that the conductive liquid emitted by the spout 21 falls as an unconfined stream 11 through the test station 12 and perpendicularly onto the insulated wire 15 under test. Complete surface contact is made between the conductive liquid and the insulation jacket 16 because the liquid is drawn around the wire 15 by capillarity thus avoiding the requirement of a prewetting station to wet the insulation jacket 16 prior to entering the test station 12. The electrically conductive liquid may be any otherwise satisfactory liquid, capable of conducting electricity but preferably tap water is used because of its low cost and universal availability. The conductivity of the tap water may be increased if desired by the addition of an anhydrous salt such as copper sulphate; however, the normal conductivity of tap water is usually sufficient for proper operation.

Once the conductive liquid has passed the test station 12, it may be directed to a drain or to some other disposal means; however, it is preferred that the liquid be recycled as shown. In the illustrated case, for such recycling an upwardly open collector 13 is located beneath test station 12 and in general vertical alignment therewith so as to catch the falling liquid after it passes the test station and the wire 15. The collector also functions as a reservoir and contains a supply of liquid for recirculation.

A pump assembly comprising a pump 22 having an input connected by a conduit 23 to the collector 13 and an output connected by conduit 24 to the discharge spout 21 recirculates the conductive liquid from the collector to the discharge spout to create the unconfined stream 11 as explained above.

A power source 14 applies an electrical potential to the stream 11 via lead 25 connecting one terminal 26 of the power source to the discharge spout 21, the spout being metallic and in contact with the conductive liquid and therefore functioning as an electrode. The electrical potential could be applied at any point in the conductive liquid path; however, it is preferable to use the metallic spout 21 as the electrode to minimize the length, and therefore the electrical resistance, of the path between the potential applying electrode and the test station 12, to maximize the electric current flowing in the conductive liquid when a fault in the insulation jacket 16 is detected. The output of power source 14 is adjustable over a voltage range of 5 to 500 volts measured with reference to electrical ground to permit the testing of wire insulations of differing dielectric strengths. The lower voltages permit the apparatus to test the more fragile, thin wall insulation jacket found on wire such as communication wire and foam insulation television cable while the higher voltages are used to test the thicker wall, higher dielectric strength insulation jacket wire such as electrical distribution wire.

The electrical potential applied to the conductive liquid stream 11 may be either A.C. or D.C.; however, a D.C. electrical potential is preferable to increase testing speed and reliability. Since an A.C. electric potential cyclically passes through zero it is possible for a fault in the insulation jacket 16 to be present at the test station 12 during the time the A.C. potential is zero and thus pass undetected if the wire moves out of the test station prior to the A.C. electrical potential increasing in absolute value. Since a D.C. electric potential has a steady value, faults generally cannot pass through the test station undetected.

To enable detection of a fault a resistor 20 is connected in series with the second terminal 27 of the power source 14 and ground. When a fault appears at the test station 12 electric current flows in the conductive liquid path and also through the resistor 20. A voltage detector 17 connected in parallel with the resistor 20 is sensitive to the voltage across the resistor and in response to a rise in voltage above a predetermined threshold value caused by the appearance of a fault at the test station 12 produces an output signal driving a fault indicator 18. Typically, such a voltage detector might be a monostable multivibrator having an output voltage pulse of longer duration that the input triggering pulse caused by the presence of a fault to drive generally slower responding fault indicators. The indicator 18 may be one producing an audible or visual alarm to alert the testing apparatus operator that a fault has been detected or may be a recorder or some other type of indicating device. If desired it may also be or include a mechanism for marking the wire to visually indicate the location of the detected fault.

To prevent electrical current from flowing in a path other than the path established through a fault in the insulation jacket 16 of the wire 15 under test, the various components of the testing apparatus 10 carrying the conductive liquid are electrically isolated from ground.

As shown in the drawing, the path of wire 15 under test travels without bending or altering direction through the stream of electrically conductive liquid 11 in a direction generally perpendicularly to the direction of the stream as the wire unwinds from a pay-out reel 28 and rewinds on a take-up reel 29. The conductor 19 of wire 15 is connected to the take-up reel 29 and the reel in turn is connected to ground through brushes 30 which contact the reel as the reel rotates. Although a pay-out reel 28 is illustrated in the drawing, if desired the wire may also be fed directly from an extrusion machine through the test station 12 to the take-up reel 29. A feature of the invention is that the testing apparatus is capable of satisfactorily testing wire running through the test station at relatively high speed, for example up to 5,000 feet per minute, and therefore it can handle most wire directly as it leaves the insulation extruder.

After a given portion of the wire 15 has moved through the test station 12, a small amount of conductive liquid may remain on the insulation jacket 16 and should be removed prior to the wire being wound on the take-up reel 29. For this purpose a blower 31 directs a flow of air 35 onto the insulation jacket as the wire 15 passes by it to displace any remaining liquid. The removed liquid may be caught by an appropriate collector 32 and directed to a drain or may be returned to the collector 13 for reuse as shown in the drawing. If the collector 32 returns the salvaged conductive liquid to the collector 13, it is also electrically isolated from ground.

During operation of the testing apparatus some of the conductive liquid will be lost by spillage and evaporation, thereby requiring replenishment of the liquid to maintain proper testing over a long period of time. A preferred method of liquid replenishment is to drip individual droplets 33 of such liquid from a faucet 34 or the like so as to establish electrical isolation between the faucet and the various liquid carrying components of the testing apparatus 10 and to thereby prevent current flow from the testing apparatus to the faucet 34.

While the present invention has been described in a preferred embodiment, it should be understood that numerous modifications and substitutions can be made without departing from the spirit of the invention. Accordingly, the present invention has been described in a preferred embodiment by way of illustration rather than limitation.

I claim:

1. Apparatus using a conductive liquid for testing the insulation of an insulated wire having at least one electrical conductor and an electrical insulating jacket on the conductor, said apparatus comprising:
    means for creating an unconfined stream of electrically conductive liquid flowing past a test station in one direction;
    means for applying a first electrical potential to said stream;
    means for passing a wire through said stream at said test station in a transverse direction to said one direction of said stream;
    means for electrically connecting the conductor of said wire to a ground potential; and
    means for detecting an electrical current flowing through said conductor from said stream.

2. Apparatus using a conductive liquid for testing the insulation of an insulated wire as set forth in claim 1 wherein said direction of said wire passing through said stream is generally perpendicular to said one direction of said stream.

3. Apparatus using a conductive liquid for testing the insulation of an insulated wire as set forth in claim 1 wherein said means for creating said stream includes a discharge spout for emitting said electrically conductive liquid onto said wire.

4. Apparatus using a conductive liquid for testing the insulation of an insulated wire as set forth in claim 3 wherein said discharge spout is located above said wire and in general vertical alignment with said test station.

5. Apparatus using a conductive liquid for testing the insulation of an insulated wire as set forth in claim 3 wherein said stream creating means further comprises a collector for receiving said stream after it passes said test station, and means for recirculating said liquid from said collector to said discharge spout.

6. Apparatus using a conductive liquid for testing the insulation of an insulated wire as set forth in claim 5 wherein said collector further comprises a reservoir for containing a quantity of said liquid, and said means for recirculating said liquid comprises a pump.

7. Apparatus using a conductive liquid for testing the insulation of an insulated wire as set forth in claim 5 wherein said stream creating means is electrically isolated from said ground potential.

8. Apparatus using a conductive liquid for testing the insulation of an insulated wire as set forth in claim 7 wherein said apparatus further comprises means for replenishing said conductive liquid, said replenishing means including dripping means for dripping individual droplets of replenishing liquid into the body of conductive liquid already in the apparatus so as to establish electrical isolation between said dripping means and said body of conductive liquid already in the apparatus.

9. Apparatus using a conductive liquid for testing the insulation of an insulated wire as set forth in claim 3 wherein said spout is metallic, and said means for applying said first electrical potential to said stream comprises said discharge spout.

10. Apparatus using a conductive liquid for testing the insulation of an insulated wire as set forth in claim 1 wherein said first electrical potential comprises a D.C. potential.

11. Apparatus using a conductive liquid for testing the insulation of an insulated wire as set forth in claim 10 wherein the difference between said first electrical potential and said ground potential is within the range of 5 to 500 volts.

12. Apparatus using a conductive liquid for testing the insulation of an insulated wire as set forth in claim 1 wherein said current detecting means comprises a resistor in series with the current path created when a fault is encountered, and a voltage detector in parallel with said resistor, said voltage detector being a pulse generator for producing an output pulse when the voltage across said resistor exceeds a predetermined value.

13. Apparatus using a conductive liquid for testing the insulation of an insulated wire as set forth in claim 12 wherein said means for applying a first electrical potential includes a D.C. power source with first and second terminals across which a voltage difference is maintained, said first terminal being connected to said stream creating means and said second terminal being connected to said ground potential through said resistor.

14. Apparatus using a conductive liquid for testing the insulation of an insulated wire as set forth in claim 12 wherein said current detecting means further comprises a fault indicating means, said fault indicating means being responsive to said output pulse.

15. Apparatus using a conductive liquid for testing the insulation of an insulated wire as set forth in claim 1 wherein said apparatus further comprises means for removing said conductive liquid from said wire after said wire passes through said stream.

16. Apparatus using a conductive liquid for testing the insulation of an insulated wire as set forth in claim 15 wherein said liquid removal means comprises an air blower directing a flow of air onto said wire.

* * * * *